US006648213B1

(12) United States Patent
Patterson et al.

(10) Patent No.: US 6,648,213 B1
(45) Date of Patent: Nov. 18, 2003

(54) MANUFACTURING METHOD FOR ATTACHING COMPONENTS TO A SUBSTRATE

(75) Inventors: Timothy Patterson, Costa Mesa, CA (US); Alex Lim Tiang Hock, Singapore (SG)

(73) Assignee: Saturn Electronics & Engineering, Inc., Auburn Hills, MI (US)

( * ) Notice: Subject to any disclaimer, the term of this patent is extended or adjusted under 35 U.S.C. 154(b) by 0 days.

(21) Appl. No.: 09/799,280

(22) Filed: Mar. 5, 2001

(51) Int. Cl.[7] .............................. H01L 21/44; B23K 1/20
(52) U.S. Cl. .................. 228/223; 228/180.22; 438/107
(58) Field of Search .......................... 228/223, 180.22, 228/214, 254; 438/107, 109; 257/777

(56) References Cited

U.S. PATENT DOCUMENTS

| 5,611,140 | A |   | 3/1997 | Kulesza et al. | |
|---|---|---|---|---|---|
| 6,011,313 | A |   | 1/2000 | Shangguan et al. | |
| 6,022,761 | A |   | 2/2000 | Grupen-Shemansky et al. | |
| 6,046,910 | A |   | 4/2000 | Ghaem et al. | |
| 6,121,689 | A | * | 9/2000 | Capote et al. | 257/783 |
| 6,209,196 | B1 | * | 4/2001 | Ozono et al. | 29/840 |
| 6,228,678 | B1 | * | 5/2001 | Gilleo et al. | 438/108 |
| 6,228,681 | B1 | * | 5/2001 | Gilleo et al. | 438/108 |
| 6,294,840 | B1 | * | 9/2001 | McCormick | 257/778 |
| 6,335,571 | B1 | * | 1/2002 | Capote et al. | 257/787 |

* cited by examiner

Primary Examiner—M. Alexandra Elve
Assistant Examiner—Len Tran
(74) Attorney, Agent, or Firm—Rader, Fishman & Grauer PLLC

(57) ABSTRACT

A method for manufacturing a chip assembly includes the steps of applying a controlled amount of flux to a plurality of solder balls on a die, applying a non-fluxing underfill material to a substrate, and assembling the die and substrate together to form the chip assembly such that the non-fluxing underfill material is trapped in between the die and the substrate. By applying the underfill material to the substrate before the chip is assembled rather than afterward, the inventive method increases chip assembly speed while maintaining control over flux application to prevent the solder balls from collapsing, eliminate the need for a defined solder resist window, and maintain a consistent die-to-substrate clearance at the solder joint.

13 Claims, 2 Drawing Sheets

MANUFACTURING METHOD FOR ATTACHING COMPONENTS TO A SUBSTRATE

TECHNICAL FIELD

The invention is directed to a chip assembly process, and more particularly to a process for connecting components to a substrate using solder balls and an underfill compound.

BACKGROUND ART

In a chip assembly process, electrical components are often attached to a substrate by connecting solder balls to a die, soldering the die to the substrate and then applying an underfill compound. The underfill compound is used to prevent damage to the assembled device caused by stresses from subsequent thermal variations.

In one known method, a die has a plurality of solder balls disposed on one surface for attachment to pads or traces on a substrate. Previously known methods involved applying a controlled amount of flux to a portion of the solder balls, soldering the die to the substrate via the solder balls, and then applying an underfill liquid at the die perimeter. The amount and location of the flux is carefully controlled because the amount and location of the flux determines the extent and volume of solder that will flow out from the solder balls onto the substrate in the solder joint. The underfill liquid is distributed through the solder joint by being drawn into the gap between the substrate and the die via capillary action and then cured in a time and temperature controlled process. The problem with this method is that the underfilling time and subsequent cure schedule are quite long compared to the other steps in the chip assembly process.

In an attempt to reduce the assembly cycle time, another known process shown in FIGS. 1 and 2 incorporates a fluxing underfill compound 108 in the chip assembly before the die and substrate are positioned together. No flux is applied to the solder balls 102 in this case because the underfill compound 108 is formulated to provide the fluxing action to allow assembly of the solder joint 110. Because the fluxing action is distributed throughout the entire volume of the underfill material 108, however, the solder balls 102 tend to collapse after the die 100 is attached to the substrate 106, as shown in FIG. 2. This is because the flux location is not selectively applied to the solder balls 102 and because the boundaries of the solder flow out area have not been defined by a resist system on the substrate 106. The collapsed solder balls 102 tend to cause the solder joint profile 110 to vary from chip to chip because there is no way to control the degree of wetting out of the solder joint 110. Further, the collapsed solder balls 102 may lead to early fatigue failures in the joint 110 during subsequent thermal cycling.

There is a need for a chip assembly method that reduces the time required for the underfill operation while maintaining a consistent, repeatable, and optimum solder joint profile.

SUMMARY OF THE INVENTION

Accordingly, the present invention is directed to a chip assembly method that includes the steps of applying flux to at least a portion of the solder balls on the die, applying a non-fluxing underfill to the substrate, and then attaching the solder balls to the substrate, preferably on pad or trace areas disposed on the substrate. By applying flux to the solder balls and depositing non-fluxing underfill material onto the substrate before the die and substrate are connected together rather than afterward, the inventive method increases the speed of the underfill stage in a chip assembly process while maintaining a consistent solder joint profile and sufficient clearance between the die and substrate, thereby minimizing early fatigue failures in the joint.

DETAILED DESCRIPTION OF THE PREFERRED EMBODIMENT

Figure 1:
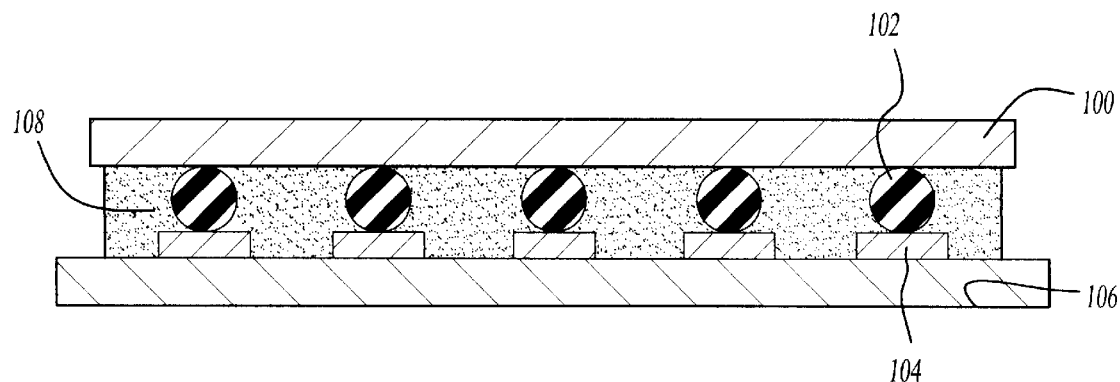
FIG. 1 is a representative diagram of chip components before reflow in accordance with a known prior art process.
Figure 2:
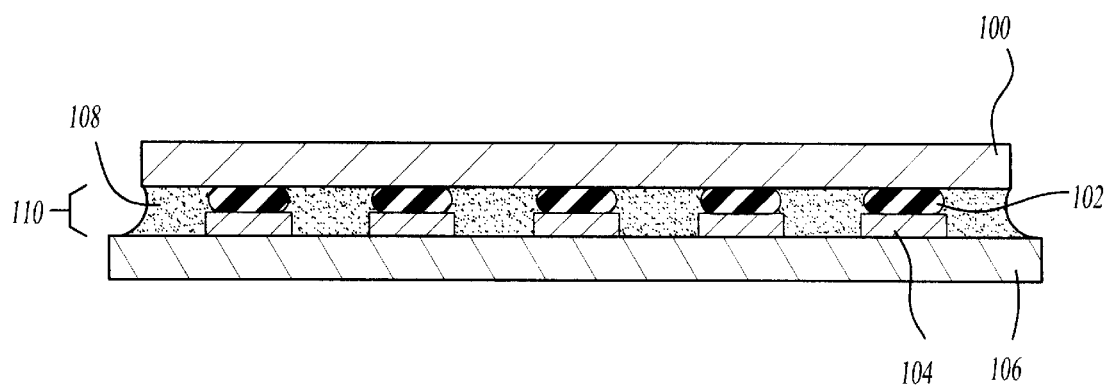
FIG. 2 is a diagram of the chip components shown in FIG. 1 after reflow in accordance with the known prior art process.
Figure 3:
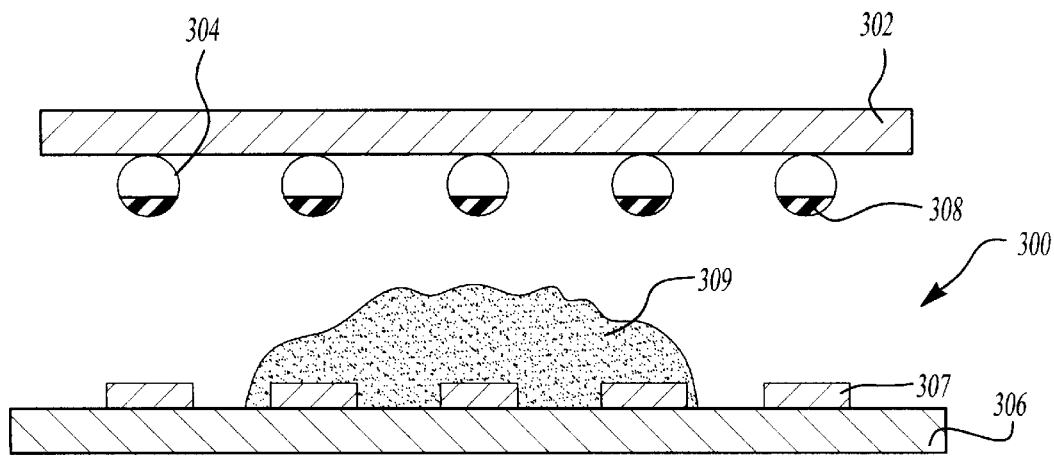
FIG. 3 is a representative diagram of chip components before placement in accordance with the process of the present invention.

FIG. 3 illustrates the components of a chip assembly 300 that is to be assembled according to the inventive process. The assembly 300 includes a die 302 with a plurality of solder balls 304 and a substrate 306 that may include a plurality of conductive pads or traces 307 corresponding to the solder balls 304. Note that although FIG. 3 shows the solder areas to be ball-shaped, the solder can have any configuration on the substrate 306. A carefully controlled amount of flux 308 is applied to the solder balls 304 on the die 302 in any known manner, such as dipping the solder balls 304 into a flux bath having a controlled depth. The amount of flux 308 on the solder balls 304 will determine the extent and volume of solder that will flow out from the solder balls 304 onto the substrate 306. Because the flow limit is not determined by a resist system barrier in the inventive method, the flux amount and the solder wetting activity are the primary ways to control the extent that the soldered joint will be wetted out. Of course, a resist system barrier (not shown) can be included in the structure 300 to further control solder wetting activity, if desired, but it is not necessary in the inventive method.

The inventive method attaches the die 302 to the substrate 306 by matching the solder balls 304 to conductive pads or traces 307 disposed on the substrate 306 or to some other conductive surface (not shown) on the substrate 306. Before the die 302 and substrate 306 are soldered together, a non-fluxing underfill material 309 is applied to the substrate. Unlike currently used methods, the underfill 309 used in the inventive method does not have any fluxing action. Thus, the amount and location of the flux is confined to the soldering site, preventing the solder from wetting out onto the substrate in an uncontrolled manner, as is the case with the fluxing underfill used in current methods.

Once the non-fluxing underfill 309 is applied to the substrate 306, the chip is assembled together by attaching the solder balls 304 on the die 302 to the pads 307 on the substrate 306. The movement of the die 302 downward onto the substrate 306 traps the non-fluxing underfill material 309 in the solder joint 310. After the solder balls 304 on the die 302 contact the substrate 306, the chip assembly 300 passes through a reflow cycle to reflow the solder joint 310 and cure the underfill material 309, encapsulating or encasing the solder balls 304 forming the solder joint 310.

Figure 4:
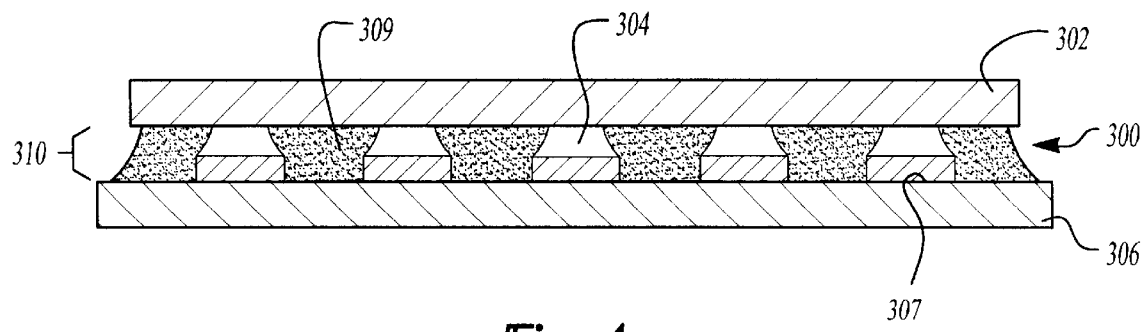
FIG. 4 is a diagram of the chip components shown in FIG. 3 after assembly in accordance with the inventive process.

FIG. 4 shows the completed chip assembly 300 after the reflow cycle. As can be seen in the Figure, the solder balls 304 do not allow the die 302 to collapse onto the substrate 306 because the selective application of flux only allows specific portions of the solder balls 304 to be wetted out into the solder joint 310. As a result, the die-to-substrate clearance and solder joint profile 310 can be kept consistent from chip to chip. Further, the die-to-substrate clearance is kept large enough to ensure that subsequent thermal cycling will not cause fatigue failures in the solder joint 310.

Thus, the inventive method delivers flux only to soldering sites, yet avoids the delays incurred in prior art processes where the underfill material is applied after the die and substrate are assembled together. Instead, the inventive method applies flux to selected areas of the solder balls and non-fluxing underfill to the substrate before assembly, thereby reducing manufacturing time without experiencing solder ball collapse.

It should be understood that various alternatives to the embodiments of the invention described herein may be employed in practicing the invention. It is intended that the following claims define the scope of the invention and that the method and apparatus within the scope of these claims and their equivalents be covered thereby.

What is claimed is:

1. A method for connecting a die having at least one solder portion to a substrate including pads or traces, comprising the steps of:

applying flux to at least one selected area of said at least on solder portion;

applying an unhardened, deformable non-fluxing underfill material to a select area of said substrate; and moving the die toward the substrate via said at least one solder portion, wherein the unhardened deformable non-fluxing underfill is trapped between said solder portion of said die and said substrate to form a solder joint that encases a solder ball above said select area of said substrate to provide a solder joint with substantially consistent die-to-substrate clearance, the solder ball is in an uncollapsed condition prior to hardening of the underfill material and does not allow the die to contact the substrate, and the pads or traces do not collapse during assembly of the solder portion to the substrate.

2. The method of claim 1, wherein the substrate includes at least one pad corresponding to said at least one solder portion, and wherein the assembling step includes the step of soldering said at least one solder ball to said at least one pad.

3. The method of claim 1, wherein the step of applying flux to said at least one solder portion includes the step of placing said at least one solder portion into a flux bath.

4. The method of claim 3, wherein the flux bath has a controlled depth.

5. The method of claim 1, wherein the flux is applied to less than an entire surface area of said at least one solder portion.

6. The method of claim 1, further comprising the step of curing the non-fluxing underfill material.

7. The method of claim 6, wherein the curing step is conducted via a time and temperature controlled process.

8. The method of claim 1, wherein the solder joint is formed by encapsulating the solder portion in the non-fluxing underfill material.

9. A method for connecting a die having a plurality of solder balls to a substrate having a plurality of pads corresponding to said plurality of solder balls, comprising the steps of:

applying flux to a selected area of each of said solder balls;

applying a deformable, unhardened non-fluxing underfill material to said substrate;

soldering the plurality of solder balls to the plurality of pads, wherein the deformable, unhardened non-fluxing underfill material is trapped in between the die and the substrate to form a solder joint with a substantially consistent die-to-substrate clearance, wherein the solder balls do not collapse upon the substrate; and curing the deformable non-fluxing underfill material that controls at least one of time and temperature.

10. The method of claim 9, wherein the step of applying flux to said plurality of solder balls includes the step of placing said plurality of solder balls into a flux bath.

11. The method of claim 10, wherein the flux bath has a controlled depth.

12. The method of claim 10, wherein the flux is applied to less than an entire surface area of each of said plurality of solder balls.

13. The method of claim 9, wherein the solder joint is formed by encapsulating the plurality of solder balls in the non-fluxing underfill material.

* * * * *